United States Patent [19]
Fraas et al.

[11] Patent Number: 5,118,361
[45] Date of Patent: Jun. 2, 1992

[54] TERRESTRIAL CONCENTRATOR SOLAR CELL MODULE

[75] Inventors: Lewis M. Fraas, Issaquah; Nurullah Mansoori, Redmond; Namsoo P. Kim, Bellevue; James E. Avery, Fall City, all of Wash.

[73] Assignee: The Boeing Company, Seattle, Wash.

[21] Appl. No.: 527,038

[22] Filed: May 21, 1990

[51] Int. Cl.⁵ .................. H01L 31/05; H01L 31/052; H01L 31/048; H01L 31/18
[52] U.S. Cl. .................................. 136/246; 136/244; 136/249; 136/251; 437/2; 437/5
[58] Field of Search ............... 136/244, 245, 246, 248, 136/249 TJ, 251; 437/2-5, 205, 207, 221

[56] References Cited
U.S. PATENT DOCUMENTS

| | | | |
|---|---|---|---|
| 4,019,924 | 4/1977 | Kurth | 136/251 |
| 4,173,820 | 11/1979 | Mueller et al. | 437/2 |
| 4,191,593 | 3/1980 | Cacheux | 136/259 |
| 4,746,371 | 5/1988 | McLeod et al. | 136/249 TJ |
| 4,776,893 | 10/1988 | McLeod et al. | 136/249 TJ |
| 4,836,861 | 6/1989 | Peltzer et al. | 136/246 |

*Primary Examiner*—Aaron Weisstuch
*Attorney, Agent, or Firm*—Donald J. Lisa

[57] ABSTRACT

Solar cells, particularly GaAs/GaSb tandem solar cells, are mechanically and electrically connected in the form of a string using a flexible circuit tape and mounted in optical alignment with solar energy concentrators in a module. A heat spreader body is attached to each cell unit as part of a heat sink and the cells are precisely positioned to provide optical alignment. The flexible circuit tape is formed by conductive strips sandwiched between layers of polymer dielectric tape and provided with tabs at predefined holes in the tape for bonding to current carrying surfaces of concentrated sunlight tandem solar cell units.

36 Claims, 5 Drawing Sheets

TERRESTRIAL CONCENTRATOR SOLAR CELL MODULE

This invention relates to solar cells and more particularly to a module wherein groups of concentrated sunlight solar cell units are connected together by a flexible circuit tape and mounted in optical alignment with radiant energy concentrators.

REFERENCE TO RELATED APPLICATIONS

The invention claimed herein is related to inventions disclosed in commonly owned co-pending applications of Girard et al, U.S. application Ser. No. 339,311, filed Apr. 17, 1989, now abandoned; Fraas et al, U.S. application Ser. No. 07/523,710, filed May 14, 1990; Fraas et al, application Ser. No. 07/527,061 filed on even date herewith; Kim et al, U.S. application Ser. No. 07/230,402, filed Aug. 9, 1989; and Kim et al, U.S. application Ser. No. 07/389,728.

BACKGROUND

Solar cell array design seeks to optimize the electrical power output and either to minimize weight for space use or to minimize cost for terrestrial use.

Tandem cells produce the highest energy conversion efficiencies, especially in concentrator arrays. Developing a cost efficient array design process for fabrication is critical to success. Array modules must provide cell interconnects with voltage and current matching, preserve the integrity of the fragile cells, allow repair and replacement during fabrication, provide alignment at the focus of the concentrating lens to within close tolerance, and dissipate heat which is associated with operation of the cell units.

The McLeod U.S. Pat. No. 4,776,893 discloses a tandem stacked GaAs/GaSb cell unit that is not economic to fabricate. Interconnections between the upper and lower cells, the interconnection between adjacent cell units, and the mounting of the cell units in optical alignment with solar collection lenses in a manner that facilitates dissipation of heat that is associated with the operation of each of the GaAs and GaSb cells are inadequate for many applications.

SUMMARY OF INVENTION

A feature of this invention is to provide a novel terrestrial solar cell module for use in an array of solar cell units each associated with a respective light concentrator or lens, a flexible circuit carrier tape and solar cells, typically GaAs/GaSb tandem photocells, for maximum energy conversion efficiency to provide cell interconnects with voltage and current matching. The flexible circuit carrier tape is formed by conductive strips sandwiched between layers of polymer dielectric tape and provided with tabs at predefined holes in the tape for bonding to current carrying surfaces of the tandem photocell units.

Another feature of this invention resides in the formation of a string of concentrated sunlight solar cell units that are secured to heat spreader bodies by a flexible circuit carrier tape so that the heat spreader bodies can be set precisely in position during alignment of the solar cells with the areas of focused radiant energy.

Alignment may be accomplished by first bonding GaAs/GaSb photocells into cell units, attaching cell unit terminals to circuitry in a flexible circuit carrier tape to form a string, and thereafter bonding the lower surface of each cell unit on the upper surface of a heat spreader. The heat spreaders with their respective solar cell units attached, are then placed in a row on a module with an adhesive that allows final precise optical alignment with the light concentrator before the adhesive is cured.

The flexible circuit tape is protected against damage from the focused radiant energy by use of a secondary collecting and focusing element, generally either a metal funnel or a reflective metal coating on an upper surface of the flexible circuit tape.

These and other features and advantages of the invention will become more fully apparent from the claims and from the description as it proceeds in conjunction with the drawings.

DETAILED DESCRIPTION OF PREFERRED EMBODIMENT

Figure 1:
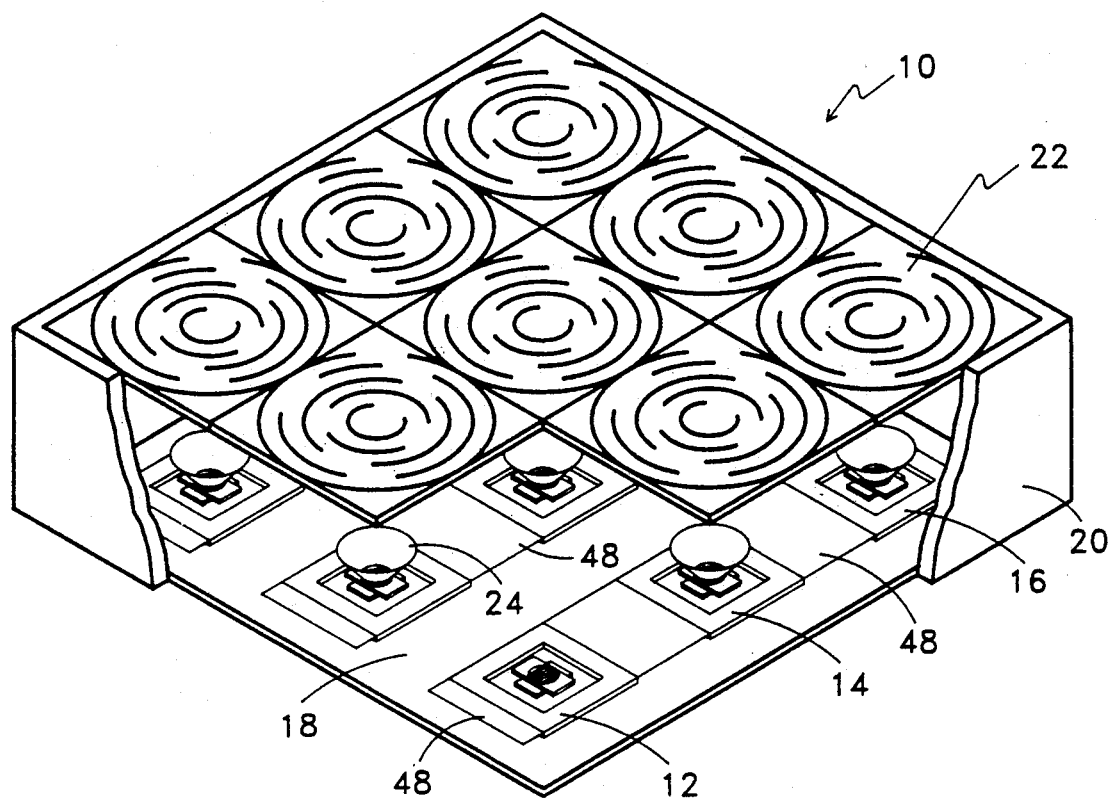
FIG. 1 is an isometric view, partially cutaway, of a photovoltaic concentrator module having nine, concentrated sunlight, tandem solar cell units.

With reference to FIG. 1, an illustrative module 10 for use as a component in a solar array has nine, mechanically-stacked tandem solar cell units in three rows with each row having three cell units 12, 14 and 16. Modules of other convenient sizes may be used, with a module having two parallel rows of six cell units in each row being also a preferred size. The cell units 12, 14 and 16 are supported on the base 18 of a housing having side walls 20 that provide support for nine plastic Fresnel lenses 22 that may be formed separately or as a unitary structure. Under each Fresnel lens 22, a secondary radiant energy concentrator 24 in the form of a funnel made of a reflective sheet metal may be used to optimize light collection efficiency and to protect the module against lens/cell misalignment. The cone angle of the funnel is chosen to optimize light collection efficiency.

Figure 2:
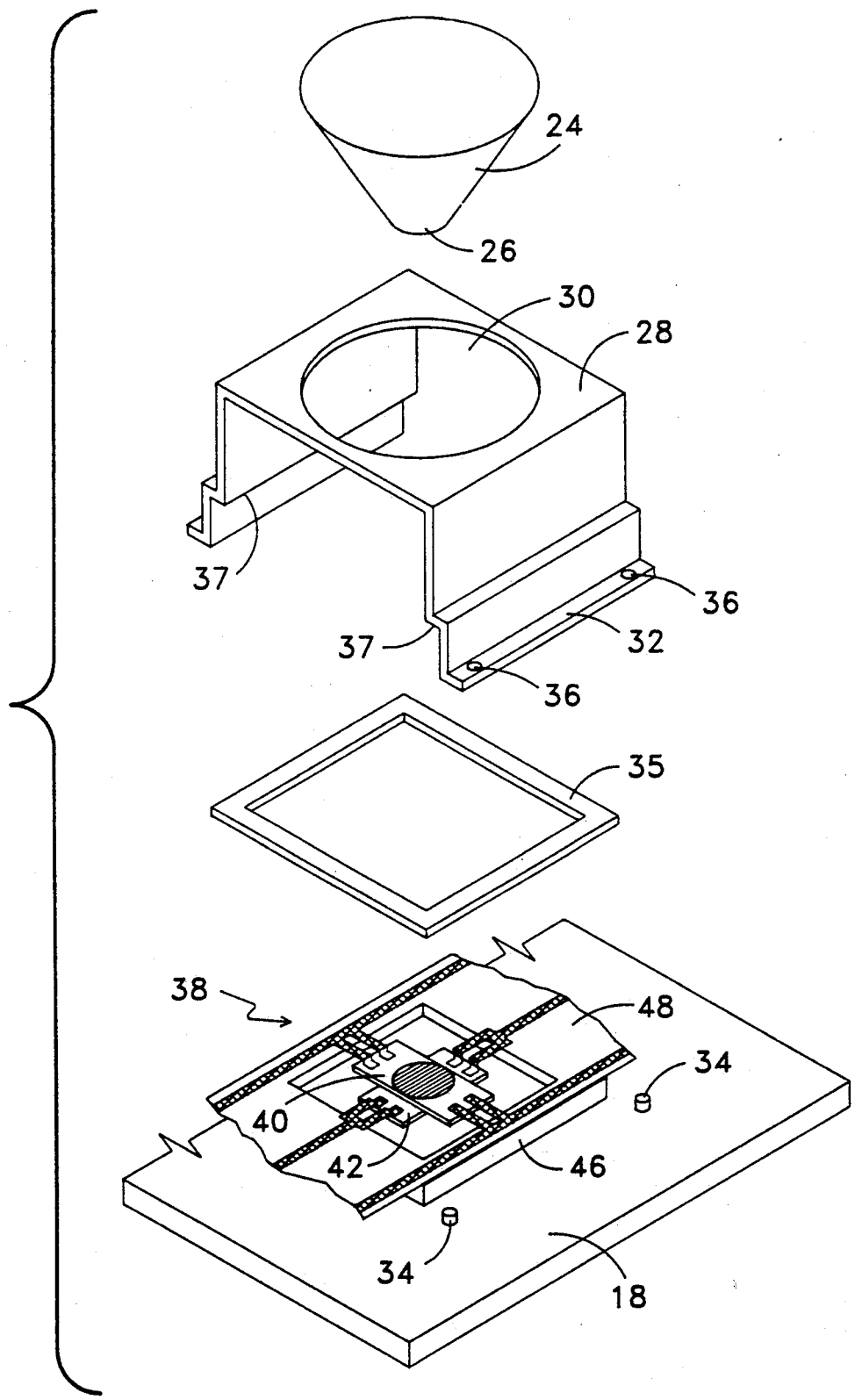
FIG. 2 is an exploded view of parts, excepting the lens 22, that are associated with one of the solar cell units illustrated in the module of FIG. 1.

With reference to FIG. 2, the funnel 24 may be supported by a bracket 28 which has an upper central opening 30 to support the funnel 24 and a flange 32 on each lower side that fits on the base 18 of the housing of module 10. To index the position of bracket 28 with respect to the base 18 and to provide the required alignment with the focal point of the Fresnel lens, suitable configurations such as screws 34 through the base 18 and holes 36 in flange 32 may be provided. A gasket 35 that may serve as a hold-down has a rectangular configuration as shown in FIG. 2 may engage surfaces 37 of the bracket 28 and serve as a means to clamp the underlying photocell unit 38 precisely in place.

Figure 3:
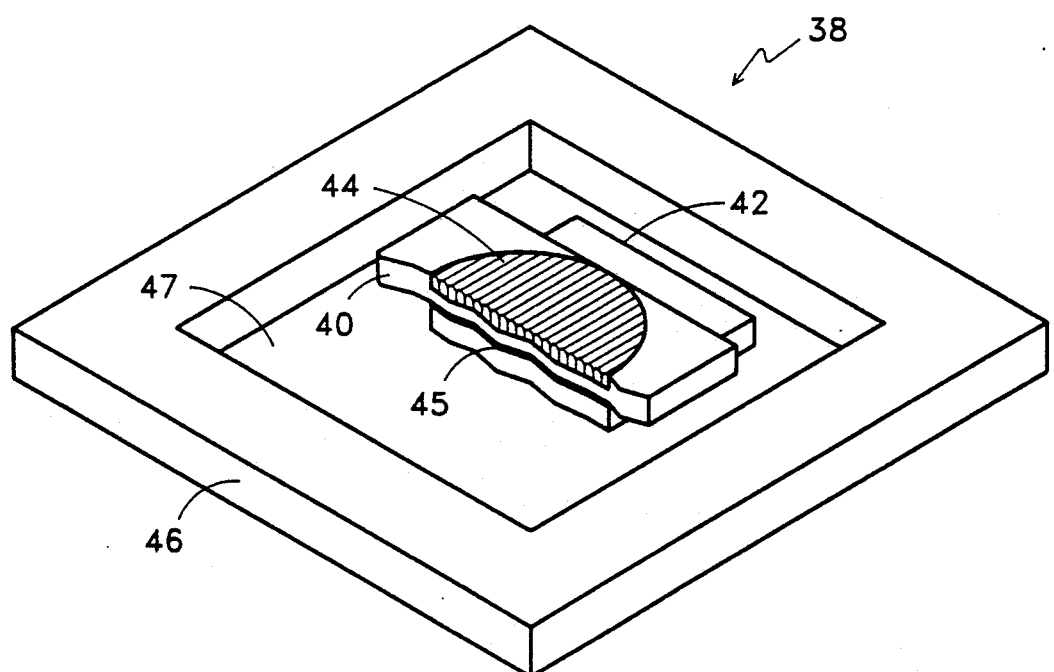
FIG. 3 is a schematic partially sectional isometric view of a preferred tandem solar cell for use in the module of FIG. 1.

With reference also to FIG. 3, a tandem cell unit 38 comprises an upper cell 40 and lower cell 42. The energy conversion efficiency of GaAs as the semiconductor is very favorable for use as the upper cell 40 and the efficiency of GaSb at longer wavelengths suggests a preference for its use as the lower cell 42. These cells may be fabricated as described in co-pending application Ser. No. 07/523,710, filed May 14, 1990, the disclosure of which is hereby incorporated by reference.

The cells 40, 42 may have parallel upper and lower surfaces and preferably have a rectangular configuration so that they may be positioned one on top of the other in a crossed relationship. The electrical current carrying surfaces on both cells are on opposite sides of the respective cell and because of their rectangular shape and being mounted in a crossed relation, current carrying surfaces extend beyond the circular center area having grid lines 44 which is the photoactive region.

This construction eases the difficulty of making the four separate connections to the four terminals of the two cells. The grid lines 44 of the upper cell 40 are preferably obscured by use of a glass cover slide 49 having a lens arrangement as described in the above-identified application Ser. No. 07/523,710. The lower surface of the upper cell 40 may be secured directly to the upper surface of the lower cell 42 as by a glass bead filled adhesive 45 that is transparent to the radiation at the wavelengths to which the lower cell is responsive. The lower cell 42 receives radiation which passes through the upper cell 40. To maximize the energy conversion efficiency of the tandem cell, mechanically stacked GaAs/GaSb cells are preferred.

Conventional GaAs cells must be made transparent to achieve the highest conversion efficiency in a tandem or stacked call application. Several methods of forming GaAs photovoltaic cells are known in the art, as explained in the McLeod et al U.S. Pat. No. 4,776,893. Further recent developments are reported in an article "Tertiary Butyl Arsine Grown GaAs Solar Cell" by Sundaram et al, *Appl. Phys. Lett.* 54 (7), Feb. 12, 1989, where growing p- and n-doped GaAs layers and p-AlGaAs layers for use as a concentrator solar cell structure is described. See also Fan et al, U.S. Pat. No. 4,547,622.

Three modifications to such GaAs cells are made when used with GaSb lower cells to optimize the conversion efficiency. First, the conventional continuous back metallization should be replaced with a gridded metallization. The back grid should use fewer grid lines than the front grid because the thicker wafer conductivity is much higher than the thinner emitter conductivity. The shading from the back grid can thereby be negligible. In small cells, the back grid may be omitted entirely.

Second, the wafer n-dopant density of the GaAs material should be reduced from $1 \times 10^{18}$ cm$^{-3}$ to about $1 \times 10^{17}$ cm$^{-3}$ to reduce free electron absorption.

Third, the anti-reflective (AR) coatings on the front and back of the GaAs cell are modified in order to provide minimal reflection across a broader bandwidth to assure passage of longer wavelength energy to which the GaSb cells are responsive.

The presently preferred transparent GaAs cell design incorporates a 450 micrometer (micron) thick n-type wafer doped to about $1 \times 10^{17}$ cm$^{-3}$ with complete photovoltaic epitaxial structure grown on it including an AlGaAs window layer. A three layer AR coating on the front surface in addition to the AlGaAs window layer serves as the front side AR coating and a two layer AR coating has been applied to the back side in some embodiments. Important design parameters include the thickness and refractive index of each layer including the AlGaAs which functions not only as an electronic heteroface but also as one of the front AR layers. This multi-layer optical system produces a very broadband reflectance minimization through the visible energy range on out beyond the GaSb band edge at 1700 nm.

Figure 4:
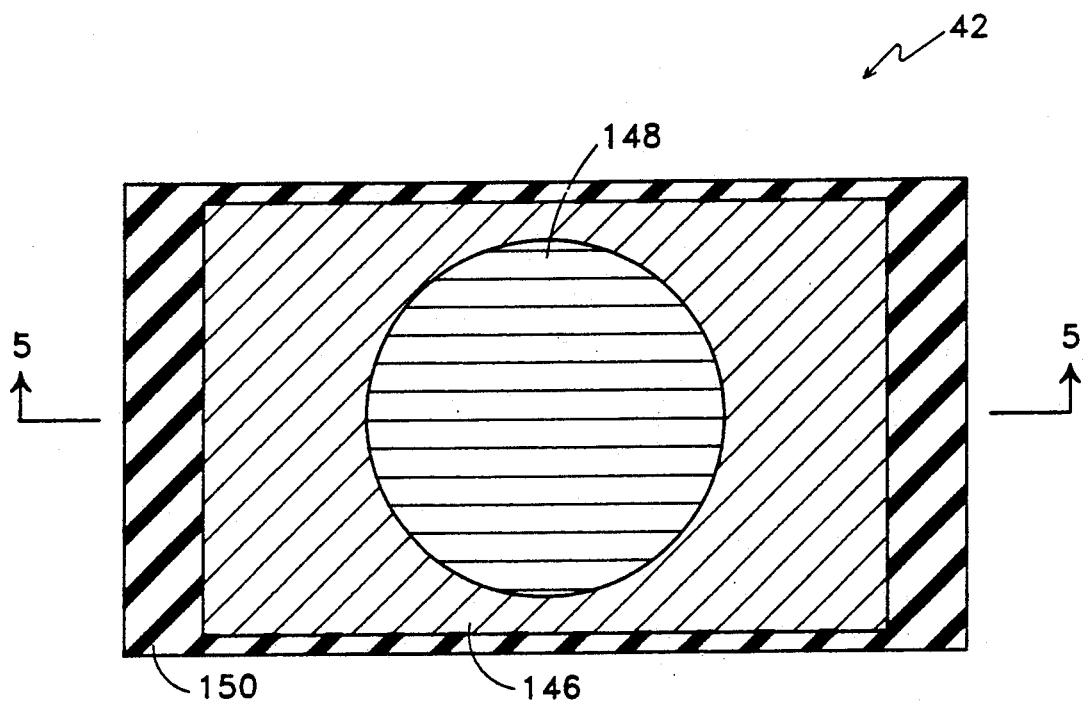
FIG. 4 is a plan view to an enlarged scale of a GaSb photovoltaic cell.
Figure 5:
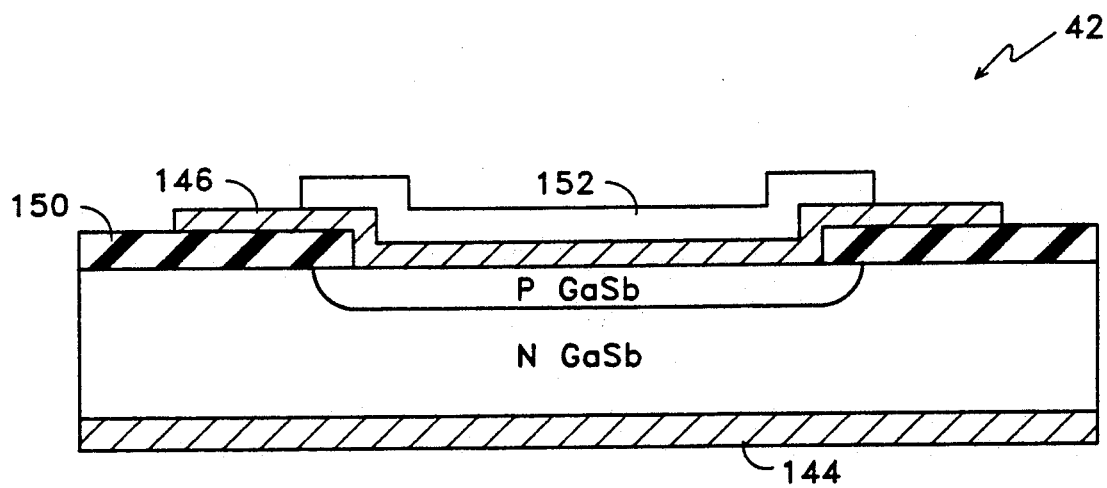
FIG. 5 is an elevation in section taken along lines 5—5 of FIG. 4.

The n-type GaSb cell is preferably a zinc-diffused cell. FIGS. 4 and 5 diagrammatically illustrate the lower cell.

The cell shown in FIG. 5, has a metallized base 144 which may be connected to one output terminal. The bus conductor layer 146 is an upper metallized surface which may be connected to a second output terminal. Two important aspects are that only the grid lines 148 are in contact with the semiconductor at the zinc diffused region designated P GaSb in FIG. 5 and the bus conductor layer 146 must be isolated from the GaSb semiconductor substrate. Because the process is essentially planar, the front side metallization is on an insulation mask 150 of an insulative material such as silicon nitride. An anti-reflective coating 152 is important in achieving efficient energy conversion but is not essential to operability of the solar cell.

The process for fabrication of the GaSb booster cell is generally applicable to III-V diffused junction photovoltaic cells. The reference to the specific gallium antimonide material is therefore to be construed as illustrative and not limiting. The process will be described with reference to FIGS. 6A-6E.

Preferably, n-type GaSb semiconductor material is a single crystal. The use of an n-type substrate with a room temperature carrier concentration of approximately $10^{17}$ atoms/cm$^3$ is preferred and results in good device performance without a surface passivation layer. At lower doping levels, the surface of the n-type GaSb converts to p-type to an extent that degrades device performance. At higher doping levels, excessive tunneling through a junction degrades device performance. In one embodiment, the GaSb wafer may be doped with Te to $4 \times 10^{17}$/cm$^3$. Zinc is a preferred dopant material.

The insulating layer 162 (FIG. 6A) is formed as a coating on the upper surface of the GaSb 161. Insulative layer 162 is preferably a two layer coating of silicon nitride/silicon oxynitride. This two layer system has been discovered to be effective for use on GaSb photocells. The first layer comprising silicon nitride is utilized to minimize any oxygen contact with the GaSb substrate 161. The second layer comprising silicon oxynitride is much more stable and holds up to the high temperature excursion of a subsequent diffusion step. The two-layer insulating layer may be deposited using plasma chemical vapor deposition. The first layer of silicon nitride may be about 0.01 microns thick and the second layer of silicon oxynitride approximately 0.1 microns to perform effectively. Insulating layer 162 may also be applied by sputtering.

Insulating layer 162 is next treated to form an opening exposing a portion of GaSb substrate 161 as by using standard photolithography techniques. Thus, a layer of photoresist may be deposited in a patterned form on the insulating layer 162. Thereafter the photoresist is developed to remove the insulating layer 162 at the opening where P GaSb region is formed. A p-type dopant material, such as zinc, is then diffused into the exposed surface of GaSb substrate 161 to serve as a conductivity type modifier and form a p/n junction and p-type emitter 164.

Figure 6A:
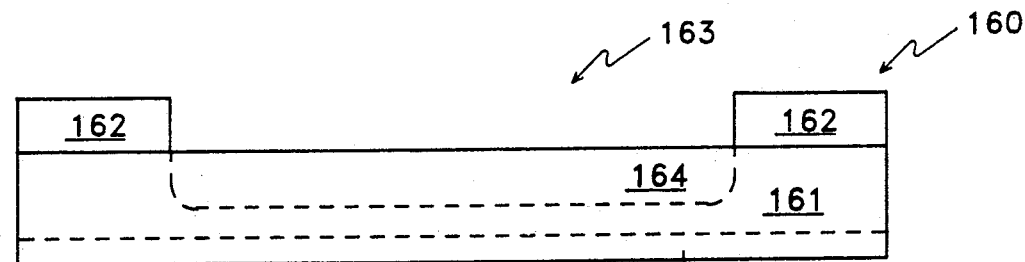
FIGS. 6A-6E are process flow diagrams outlining a preferred process for fabricating a GaSb cell.

The diffusion step may be accomplished using a quasi-closed graphite box, not shown, in a conventional manner. The box has an elemental zinc source and an elemental antimony source. The elemental Sb source is provided to build up the antimony pressure in the diffusion chamber to prevent portions of the antimony in substrate 161 from exiting substrate 161. The elemental Zn provides a source of p-type dopant atoms which diffuse through opening 163 into the lattice of substrate 161. The concentration versus depth into substrate 161 of the Zn dopant atoms is a function of time and temperature. The diffusion step preferably creates an emitter doped in the mid-$10^{20}/cm^3$ range to a depth of approximately 0.5 micrometers (microns). During the diffusion process, an unwanted zinc diffused region 165 forms on the back side of the substrate 161 as illustrated in FIG. 6A.

Figure 6B:
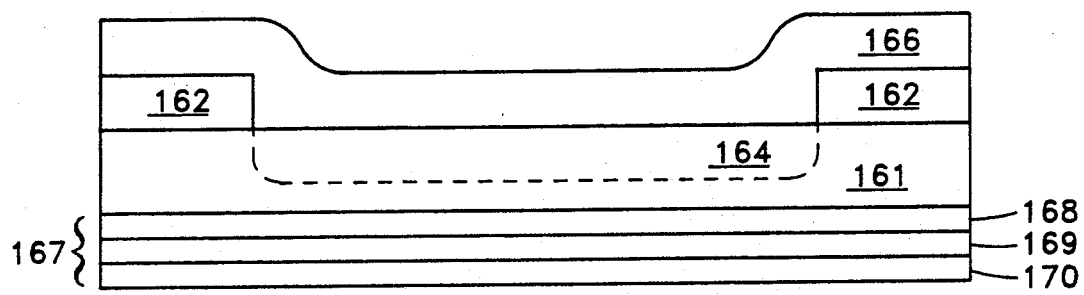
Figure 6C:
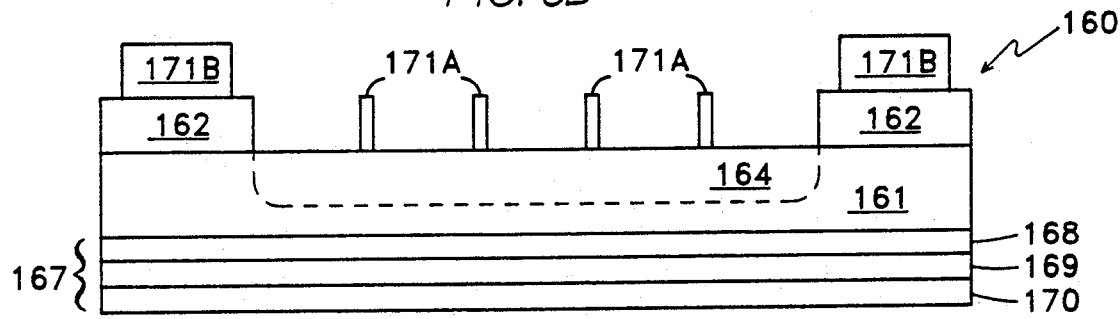

Following the diffusion step, a protective photoresist layer 166 is deposited on the surface of substrate 161 to form a patterned insulating layer 162 as shown in FIG. 6B. The back side or lower surface of substrate 161 is thereafter non-selectively etched to remove unwanted zinc that has diffused into region 165. Protective photoresist layer 166 is removed and a back side metallization contact layer 167 is formed.

Metallization contact layer 167 must have low electrical resistance, be adherent to the lower surface of substrate 161 and meet the qualifications for use in space or terrestrial applications. A typical example may comprise three layers of metal: a layer of titanium (Ti) 168, a layer of palladium (Pd) 169, and a layer of gold (Au) 170. Platinum (Pt) would also be an acceptable alternative to palladium 169. Gold 170 is used because of its good electrical properties. Palladium 169 is used as a gold diffusion barrier to make contact between titanium 168 and gold 170 and to prevent gold 170 from diffusing into titanium 168 or substrate 161, FIG. 6B. The back side metal layers may be alloyed in a furnace.

A second photolithographic step is used to form the gird pattern for a top metal 171. Top metal 171 consists of a grid portion of parallel lines 171A of conductive material and a bus portion 171B of conductive material. Top metal 171 may comprise a layer of Pt and a layer of Au. Top metal 171 is formed using standard metal liftoff techniques. In actual processing, the thickness of metal layer 171 may be approximately 0.3 microns. Only the grid lines touch the junction region. The bus pad is deposited only on the patterned insulative material and is isolated from the n-type semiconductor substrate.

Figure 6D:
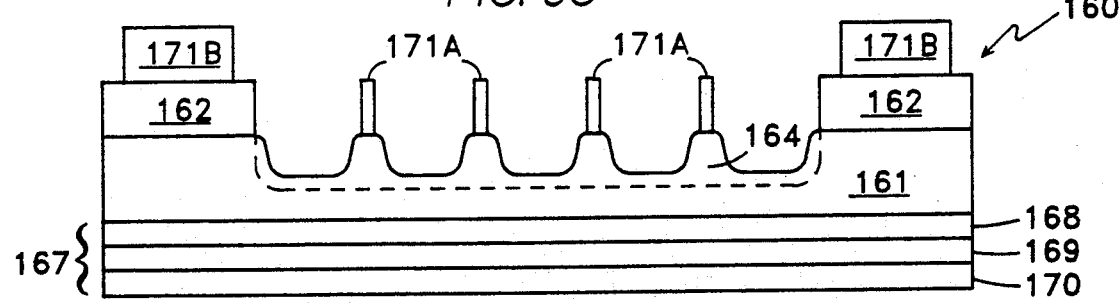

A front side etch is then performed to reduce the emitter thickness. This is illustrated in FIG. 6D but the drawing is not to scale. It should be noted that while the front side etch is not necessary, it has been found that with removal of emitter material to provide a recess between grid lines 171A beneficial results are obtained. For example, if the depth of the recess is sufficient so that the emitter material thickness is reduced from about 0.5 micrometers to about 0.1 micrometers, the device short circuit current rises by a factor of about 2.

Figure 6E:
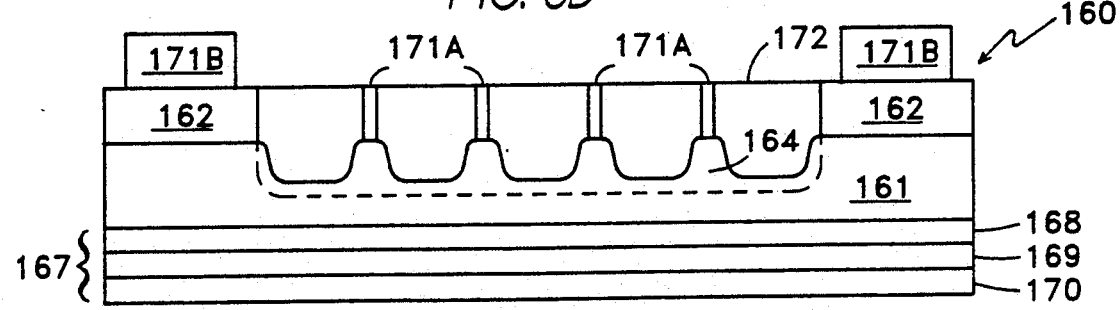

An anti-reflective coating 172 may be deposited as a coating over the emitter between the grid lines 171A as illustrated in FIG. 6E. FIG. 6E, like FIG. 6D, is diagrammatic and not to scale. Anti-reflective coating 172 may comprise a single layer or double layers and is often deposited using a vacuum deposition process as discussed in conjunction with the upper GaAs layer fabrication. It should be apparent to those skilled in the art that anti reflective coating 172 should be tailored specifically for a spectral region of interest for a booster cell. One preferred embodiment of anti-reflective coating 172 is tantalum pentoxide ($Ta_2O_5$) having a thickness of approximately 0.15 microns which was found to raise the short circuit current by another 1.5 times.

Figure 7:
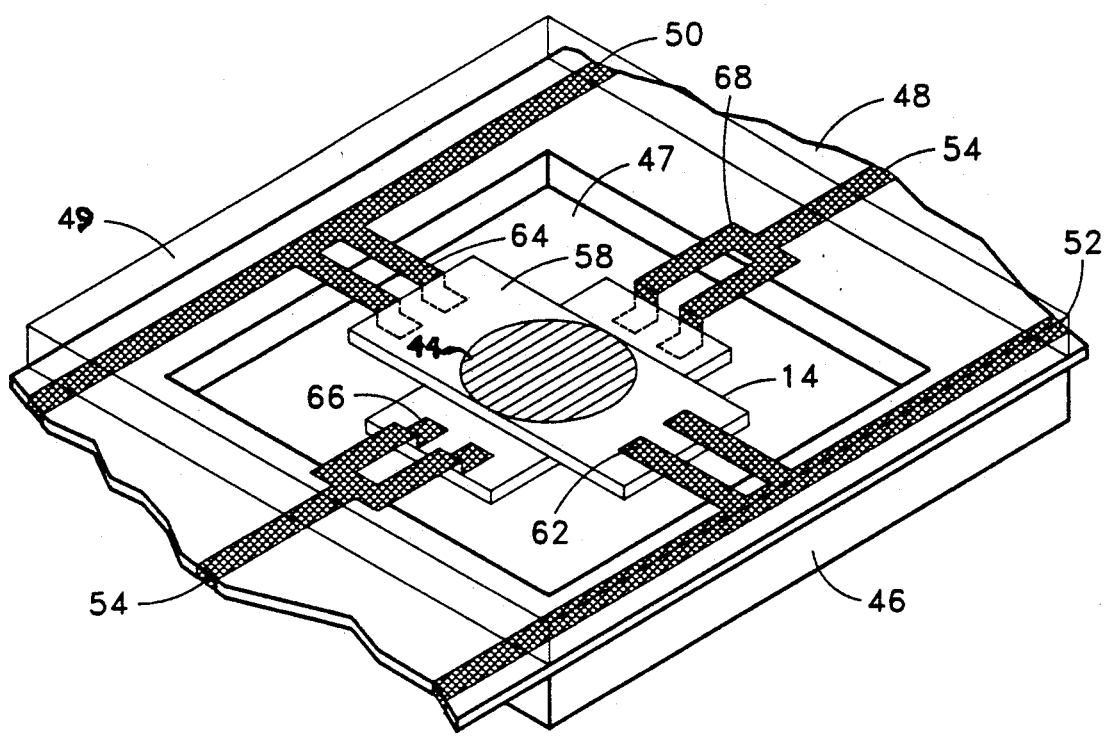
FIG. 7 is another schematic isometric view of the tandem cell shown in FIG. 3 mounted on a flexible tape and showing an underlying heat spreader.

It is important to remove the heat associated with cells 40 and 42. As illustrated in FIGS. 2 and 7, heat spreading body 46 is positioned on the surface of base 18 of the housing of module 10 so that the heat spreading body 46 and the surface 18 serve as a heat dissipator or heat sink. Heat spreading body 46 may be made of a thermally conductive material such as AlN or of a suitable metal such as copper that is covered by a layer of insulation to avoid interference with the electrical connection of the cells.

The upper surface of heat spreading body 46 may contain a recess 47 as shown in FIGS. 3 and 7 for receiving the lower surface of the lower cell 42. The lower cell 42 with tabs 68 (FIG. 7) in place may be soldered to a fixed position in recess 47 so that the radiant energy receiving area of the photocells remains fixed once the heat spreading body 26 is installed on housing base 18. The depth of recess 47 may be approximately equal to the thickness of the tandem cell unit 38. A glass cover slide 44 having a size approximating that of the heat spreader body may be added after the cell unit 38 is electrically connected in a circuit.

Figure 8:
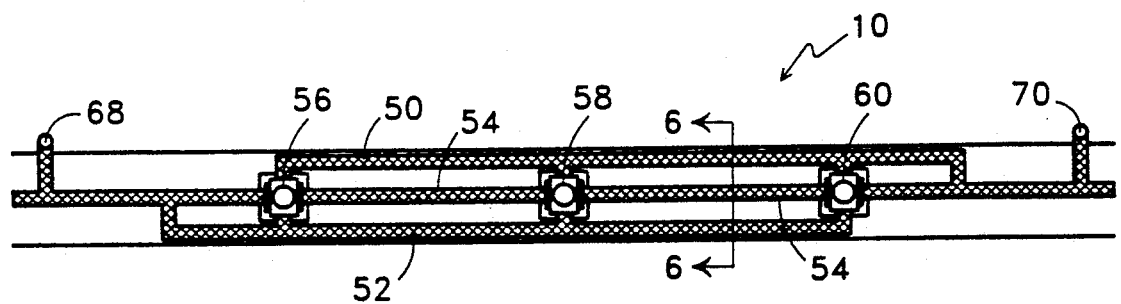
FIG. 8 is a plan view of a preferred flexible circuit carrier tape showing apertures for three tandem photocells and conductive strips used for collecting the generated electrical power and providing a two terminal unit.

With reference to FIG. 1, for GaAs/GaSb tandem cells, three cells 12, 14, 16 are electrically interconnected together. In FIG. 8, a flexible circuit carrier, which may be in the form of a tape 48, provides bus connector strips for connecting the upper GaAs cells in parallel and three GaSb lower cells in series. Two terminals 68 and 70 are left for interconnecting the carriers into the module and array as applicable. The illustrated embodiment has three parallel strips of an electrically conductive material. Strips 50 and 52 lie along outer marginal edges of the tape 48 and a central strip 54 extends between apertures 56 and 58 and between apertures 58 and 60.

Figure 9:
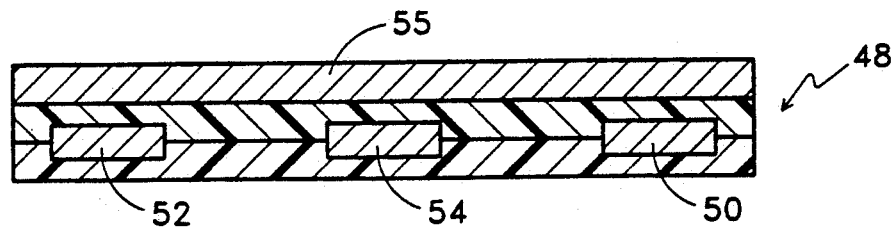
FIG. 9 is a cross-sectional view of the flexible circuit tape taken generally along line 6—6 of FIG. 5.

As shown in FIG. 9, the conductors 50, 52, 54 lie in a plane and are preferably composed of strips that have been cut from a copper foil sheet that has been chosen to have the appropriate thickness for the current involved. The copper strips may have a width of 4 mm and have tabs 62, 64, 66, 68 (see FIG. 7) which include portions that extend transverse to the longitudinal direction of the tape 48. The chip may have a rectangular shape with dimensions of about 7 mm by 8 mm. The active area under the grid lines may have a diameter of about 5.5 mm. The tape is made of a suitable polymeric insulating material such as a polyimide. A thin layer 55 of a reflecting material such as aluminum that is electrically insulated from the conductors 50, 52, 54 may be applied on the upper surface of tape 48. Where the cone or funnel 24 is not used, the layer 55 of reflective material will provide added protection to the carrier tape 48 in the event the focus of the lens falls inadvertently or temporarily on the carrier tape rather than on the cells.

In a preferred embodiment, the insulating material of tape 48 is cut to an appropriate width which for the cell size given above, may be about 3 cm. Apertures 56, 58 and 60 are formed at spaced intervals along its length which correspond to the positions of the photocell units shown in FIG. 1. The copper strips 50, 52 and 54 are then placed on one layer of insulating material and thereafter a second layer of insulating material is placed on top of the strips 50, 52 and 54 with apertures in each layer of insulating material being aligned.

One or both of the layers of insulating material may have tear strips on one or both of the side edges of tape 48 that are configured to be engaged by a sprocket wheel (not shown) which will drive tape 48 through an assembly line of work stations. One suitable arrangement is to provide tractor holes in tear off strips to enable use of standard processing equipment such as reelers and wire bonding equipment.

Apertures 56, 58 and 60 that are formed in the flexible circuit carrier 48 are spaced to match the locations and sized to the photocell units 12, 14, 16.

With reference to FIG. 7, the flexible carrier tape 48 is shown with aperture 58 that may have a rectangular shape at one of the tandem cell units 14. Strip 52 of the circuit carrier 48 is shown to have tabs 62 which extends transversely of the tape 48 and into aperture 58. Tabs 62 are bonded to the current carrying surface which is on the upper side of the upper cell 40. Strip 50 of the flexible circuit tape 48 is shown to be connected to the current carrying surface on the lower side of the upper cell by tabs 64.

One end of central strip 54 in the carrier tape 48 is connected to the upper surface of the lower cell by tabs 66 and to the lower contact carrying surface of the lower cell 42 of an adjacent cell unit. By this arrangement, the upper cells are connected electrically in parallel whereas the lower cells are connected electrically in series. Since the operating voltage of a GaAs cell is about three times greater than that of a GaSb cell, the electrical output of the three tandem cell assemblies or units can be effectively interconnected to provide two terminals 68 and 70.

The tabs 62, 64, 66 and 68 may be formed from the same copper foil when the strips 50, 52 and 54 are formed. The free ends of the tabs are bonded to the four current carrying surfaces of the upper cell 40 and lower cell 42. To enhance the mechanical strength of the bond, a coating of a material that has bonding properties better than those of copper may be used. With the current buses that are preferred on gallium based cells, the metal coating on the tabs preferably contains gold over a nickel barrier to provide a better bond than can be obtained with copper.

An upper layer of polymer is placed on top of the conductive strips 50, 52, 54 to form a laminate with the strips of conductive material sandwiched between two layers of an insulative polymer material. The upper layer is pre-formed with aligned apertures 56, 58, 60 and optionally may contain the tractor holes. The tabs 62, 64, 66, 68 are shaped and made ready for the plating process.

The tape 48 is brought together with the tandem cell unit and the tabs 62, 64, 66, 68 are bonded, preferably with a thermosonic process, to form a mechanical string containing a series of tandem photocell units. After the tandem cell unit has been connected to the conductive strips 50, 52 and 54 of tape 48, the glass cover slide 44 having a prismatic lens on the upper surface of the upper cell may be mounted with an adhesive on the upper surface of the heat spreader body 46 to sandwich the flexible circuit tape 48 therebetween. To remove air, any space between the upper surface of heat spreader body 46 and the lower surface of the glass cover slide 44 may be filled with a potting compound through holes that extend through the thickness of the heat spreader body 46.

The overall energy conversion efficiency of the tandem solar cell unit may be examined and the circuit connections between adjacent ones of the tandem cell units tested at this point in the manufacturing process. Defective cell units are repaired or removed.

The edge strips on tape 48 having the sprocket holes are thereafter removed and the circuit carrier tape 48 is cut into string lengths that correspond to the size of the modules that will be used. With GaSb booster cells under a GaAs upper cell, the string length will include cells in groups of 3 or a multiple thereof.

Adhesive in an uncured condition may be applied to the lower surface of the heat spreader body 46 and the body installed on a lower surface 18 of the housing of module 10.

The funnel 24 may be installed to be at a predetermined position with respect to the lower surface 18 of module 10. The tandem photocell unit 38 may be precisely aligned with the optical axis of the funnel 24 where the smaller end of the frustrum of cone 24 is adjacent to, but spaced a very small distance such as 1/32 inch, from the glass cover slide 44 on the upper surface of the upper cell of the photocell unit. Next the heat spreader body 46 is secured in its final position by mechanically clamping the gasket 35 of FIG. 2 onto the upper surface of the glass cover slide 44 and the adhesive on the lower surface of the heat spreader body is cured.

Plastic Fresnel lenses 22 are assembled into groups such as the 3×3 module as illustrated in FIG. 1 and thereafter installed on the housing.

While several embodiments of the present invention have been described, these are illustrative only. All changes and modifications which fall within the scope of the claims, and equivalents thereof, are intended to be embraced thereby.

What is claimed is:

1. A flexible circuit tape comprised of a base layer of electrical insulating material, parallel strips of electrically conductive foil mounted on said base layer, said circuit tape having a plurality of apertures at spaced intervals along a longitudinal direction of said tape, each of said strips of electrically conductive material having terminal portions extending free of said base layer at each aperture to have opposite surfaces that are adapted for electrical connection to an upper or lower surface of concentrated sunlight photovoltaic cells positioned in said apertures to collect electrical power generated by said cells, and an upper layer of electrical insulating material covering said foil strips.

2. A flexible circuit tape comprised of a base layer and an upper layer of electrical insulating material, an electrically conductive foil that is patterned in the form of parallel strips sandwiched between said base and upper layers, said circuit tape having a plurality of apertures at spaced intervals along a longitudinal direction of said tape, said strips of electrically conductive material having portions exposed at each aperture that are adapted for electrical connection to concentrated sunlight photovoltaic cells positioned in said apertures to collect electrical power generated by said cells; and said upper layer of insulating material having a mirror surface for reflecting radiant energy for protecting the tape against damage due to exposure of high intensity radiant energy on said mirror surface.

3. A flexible circuit solar cell array comprising:

a plurality of discrete concentrated sunlight photovoltaic cell units;

a flexible tape having a base of electrically non-conductive material supporting parallel strips of electrically conductive material;

said tape base having spaced apertures that are positioned at each of said cell units;

means for connecting the strips of conductive material to different current carrying surfaces of said cell units for collecting in said strips electrical power generated by said cell units;

said parallel strips of conductive material extending longitudinally along opposite sides of said tape and being electrically connected to different current carrying surfaces on said cell units; and said strips being made of copper foil and containing tabs which extend transversely of the tape to be free of the non-conductive material of the tape, wherein the tabs have a surface that has bonding properties that are more favorable for bonding to cell contact surfaces than copper and said surfaces of the tabs having favorable bonding properties being bonded to the current carrying surfaces of said cell units.

4. The array as defined in claim 3 wherein said flexible tape comprises an upper layer of electrically non-conductive material which overlies the strips of conductive material and said base.

5. The array as defined in claim 3 wherein each solar cell unit comprises a tandem stacked upper cell and lower cell of different semiconductive materials and is mounted on a separate body which serves as a heat spreader for heat associated with the cell unit.

6. The array as defined in claim 5 wherein the head spreader body has a recess in an upper surface into which the lower cell is positioned and the tape extends across the upper surface of said heat spreader body.

7. A flexible circuit solar cell array comprising a plurality of discrete concentrated sunlight photovoltaic cell units;

a flexible tape having a base of electrically non-conductive material supporting parallel strips of electrically conductive material;

said tape base having spaced apertures that are positioned at each of said cell units;

means for connecting the strips of conductive material to different current carrying surfaces of said cell units for collecting in said strips electrical power generated by said cell units;

said parallel strips of conductive material extending longitudinally along opposite sides of said tape and being electrically connected to different current carrying surfaces on said cell units;

said strips being made of copper and containing tabs which extend transversely of the tape, wherein the tabs have a surface that includes gold and the gold containing surfaces of the tabs are bonded to the current carrying surfaces of said cell units;

the photovoltaic cell units each comprise a tandem stacked upper cell and lower cell of different semiconductive materials with each cell having two terminals and producing a different voltage; and the two terminals of a first plurality of said upper or lower cells are connected electrically in series with additional tabs that extend longitudinally into said spaced apertures.

8. A flexible circuit solar cell array comprising:

a plurality of discrete concentrated sunlight photovoltaic cell units;

a flexible tape having a base of electrically non-conductive material supporting parallel strips of electrically conductive material;

said tape base having spaced apertures that are positioned at each of said cell units;

means for connecting the strips of conductive material to different current carrying surfaces of said cell units for collecting in said strips electrical power generated by said cell units;

said parallel strips of conductive material extending longitudinally along opposite sides of said tape and being electrically connected to different current carrying surfaces on said cell units;

said strips being made of copper and containing tabs which extend transversely of the tape, the tabs have a surface that includes gold and the gold containing surfaces of the tabs are bonded to the current carrying surfaces of said cell units; and an upper layer of said flexible tape having a mirror surface for reflecting radiant energy for protecting the tape against damage due to exposure of high intensity radiant energy positioned on said mirror surface.

9. A solar cell module having a plurality of discrete cell units wherein each cell unit constitutes a tandem cell comprising an upper cell of a first semiconductive material and a lower cell of a second semiconductive material, said module comprising:

a housing having a base and an upper portion;

said discrete solar cell units being mounted on the housing base and interconnected into a two terminal device by electric current conducting members carried on a flexible polymeric carrier tape;

primary outer lens elements supported by said housing upper portion;

a secondary radiant energy concentrating element associated with each primary lens element for protecting the carrier tape against incident light, said secondary element being supported by said housing at a position adjacent to but spaced from the solar cell unit;

each of said solar cell units being thermally coupled to the base; and parallel spaced strips of conductive material carried by said tape with means for separately connecting said strips to predetermined contact surfaces of the upper and lower cells of each cell unit.

10. A solar cell module as defined in claim 9, wherein the primary lens elements are Fresnel lenses and said secondary elements are light funnels.

11. The solar cell module as defined in claim 10 wherein the light funnels are metal.

12. The solar cell module as defined in claim 9 wherein the upper cell is GaAs, the lower cell is GaSb and the cells are mechanically stacked.

13. A solar cell module as defined in claim 9 further including a heat spreader body positioned between each solar cell unit and the base and wherein there are three parallel strips of conductive material with two outer strips disposed along opposite sides of the flexible member being continuous throughout a length embracing a plurality of cell units and a central strip that is discontinuous at each cell unit, said central strip forming a group of cells that are electrically connected in series by contacting a free portion of the upper surface of the lower cell and by contacting a portion of the lower surface of the lower cell that is adjacent to said heat spreader body.

14. A solar cell module comprising:
   a housing having primary and secondary light focusing elements;
   a plurality of rows of cell units mounted on said housing, each cell unit being associated with respective primary and secondary light focusing elements;
   each cell unit comprising a mechanically stacked tandem cell housing, an upper cell made of a first semiconductive material, a lower cell made of a second semiconductive material;
   exposed current carrying surfaces connected respectively to the upper and lower cells;
   means including a flexible electrical circuit tape comprising polymeric insulating material carrying a plurality of strips of electrical conducting material secured to a plurality of said cell units to form a string of cell units;
   a separate heat spreader body mounted in a thermally conducting relation with each of said cell units; and
   means for mounting said heat spreader bodies in a thermally conductive relationship with said housing.

15. The module as defined in claim 14 wherein the secondary light focusing element comprises a metal light funnel.

16. The module as defined in claim 15 further including a bracket coupling the funnel and the housing.

17. The module as defined in claim 16 wherein the heat spreader body mounting means includes a gasket positioned between the bracket and the heat spreader body for each cell unit.

18. The module as defined in claim 17 wherein the flexible circuit tape has three parallel strips of conductive material with two outer strips disposed along opposite sides of the flexible circuit tape and being continuous throughout a length embracing a plurality of cell units and a central strip that is discontinuous at each cell unit, said central strip forming a series connected group of cells and said outer strips forming a parallel connected group of cells; and wherein the gasket bridges across the flexible carrier.

19. The module as defined in claim 17 further having a glass cover slide positioned over said heat spreader body and said flexible circuit tape, wherein the gasket engages an upper surface of said glass cover slide.

20. A plurality of tandem solar cell units connected together and mounted in a housing, each of said units comprising:
   an upper cell made of a first semiconductive material with current carrying surfaces on opposite sides thereof;
   a lower cell made of a second semiconductive material with current carrying surfaces on opposite sides thereof;
   means for stacking said lower cell in optical alignment under said upper cell; and
   a flexible circuit tape including electrical conductors connected to said current carrying surfaces for matching the voltages from said cells and collecting electrical power generated by said cell units, said carrier comprising a flexible tape of polymer material supporting parallel strips of electrically conductive material, said tape having spaced apertures at each of the cell units, and means for connecting the strips of conductive material to different current carrying surfaces of said cell units for collecting said electrical power.

21. A cell unit as defined in claim 20 further having a heat spreader body secured to a lower surface of the lower cell and a lower surface of the upper cell is secured directly to an upper surface of the lower cell in such a manner that the current carrying surfaces of the upper and lower cells are electrically isolated.

22. A cell unit as defined in claim 20 further having a glass cover slide positioned over said heat spreader body and said flexible carrier tape.

23. A process for manufacturing a solar cell module in a housing having a base, comprising:
   providing discrete tandem photovoltaic cell units which have upper and lower cells each having opposed current carrying surfaces, said units being mounted on a support body of heat dissipating material;
   providing a flexible polymer dielectric tape including three parallel strips of conductive material with two outer strips disposed along opposite sides of the flexible tape and being continuous throughout a length embracing a plurality of cell units and a central strip that is discontinuous at each cell unit where said tape is apertured at spaced positions for receiving said cell units;
   providing interconnect tabs as part of each of said current carrying surfaces to said strips of conductive material;
   bonding said cell units to said interconnect tabs to connect together a plurality of cell units that are in the form of a string;
   said central strip forming a series connected group of cells and said outer strips forming a parallel connected group of cells;
   bonding each cell unit in the string to said support body;
   placing said support body at an approximate desired position on said housing base; and
   installing a radiant energy concentrator on said housing and adjusting the relative position between said concentrator and its related cell for proper optical alignment.

24. A process for manufacturing a solar cell module in a housing having a base, comprising:
   providing discrete photovoltaic cell units having opposed current carrying surfaces, said units comprising an upper cell of a first semiconductive material and a lower cell of a second semiconductive material mounted in optical alignment therewith, each cell has two current contact surfaces, and the cell units are mounted on a support body of heat dissipating material;
   providing a flexible polymer dielectric tape including at least two parallel strips of conductive material, said tape being apertured at spaced positions for receiving said cell units;
   providing interconnect tabs as part of each of said strips, said tabs being positioned to electrically connect said current contact surfaces to said strips of conductive material;

bonding said interconnect tabs to current contact surfaces on said upper and lower cells to form cell units that are in the form of a string;

bonding each cell unit in the string to said support body;

placing said support body at an approximate desired position on said housing base; and installing a radiant energy concentrator on said housing and adjusting the relative position between said concentrator and its related cell for proper optical alignment.

25. A process as defined in claim 24 further comprising bonding the upper and lower cells together.

26. A process as defined in claim 25 further comprising mounting a prismatic glass cover that prevents obscuration of an acting cell area by grid lines of conductive material on an upper surface of said cell unit.

27. A process as defined in claim 24 wherein said radiant energy concentrator includes a lens and a light funnel, and said process further comprises:

aligning said cell units with an optical axis of said light funnel; and securing the support body for said cell units and secondary device in a fixed relationship.

28. The product of the process of claim 27.

29. The product of the process of claim 24.

30. A process for manufacturing a solar cell module having a plurality of concentrated sunlight tandem cell units, said process comprising:

fabricating a plurality of upper photovoltaic cells;
fabricating a plurality of lower photovoltaic cells;
providing a support body which serves as a heat dissipator, said body having an electrically insulative surface for engagement with the lower of said cells;
testing the individual cells;
selecting matched cells for forming a tandem cell unit;
bonding the upper cell and lower cell into a tandem cell unit together with said support body, said cells being in optical alignment with each other so that all radiation received by a lower cell passes through its associated upper cell;

forming a flexible dielectric tape carrying a plurality of electrically conducting members that are secured to upper and lower surfaces of said upper and lower cells to form a string of electrically interconnected tandem cell units;

cutting the flexible tape into unitary lengths of cell units; and installing cut lengths of said cell units onto a surface of a housing.

31. The process as defined in claim 30 wherein the housing surface is a base at a backplane on which the support bodies are mounted in a thermal transfer relationship and the process further comprises:

providing at least one radiant energy concentrator;

positioning the support body of each cell unit in a cut tape length at an initial approximate position on said housing base and thereafter attaching said radiant energy concentrators to said housing in a fixed relation to said housing; and adjusting the final position of the support body of each cell unit in accordance with an optical alignment between the photocell unit and a respective one of said radiant energy concentrators.

32. The process as defined in claim 31 wherein the radiant energy concentrator includes a primary lens and a secondary light funnel and the process further comprises:

attaching each secondary light funnel to the housing base at positions indexed on the base;

aligning each tandem cell unit with an optical axis of said second device as part of the step of adjusting the final position of the photocell unit support body; and thereafter installing said primary lenses for a group of said photocell units at a position determined by said secondary devices.

33. The product of the process of claim 32.

34. The product of claim 33 wherein the upper and lower cells are made of GaAs and GaSb respectively.

35. The product of the process of claim 30.

36. The product of claim 35 wherein the upper and lower cells are made of GaAs and GaSb respectively.

* * * * *